United States Patent (10) Patent No.: US 7,221,240 B2
Chang (45) Date of Patent: May 22, 2007

(54) NARROW BANDPASS FILTER INSTALLED ON A CIRCUIT BOARD FOR SUPPRESSING A HIGH-FREQUENCY HARMONIC WAVE

(75) Inventor: Yu-Chen Chang, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 167 days.

(21) Appl. No.: 11/046,843

(22) Filed: Feb. 1, 2005

(65) Prior Publication Data
US 2006/0170518 A1 Aug. 3, 2006

(51) Int. Cl.
*H03H 7/00* (2006.01)
*H01P 1/203* (2006.01)
(52) U.S. Cl. .................. 333/176; 333/185; 333/204
(58) Field of Classification Search ............... 333/175, 333/176, 185, 204
See application file for complete search history.

(56) References Cited

U.S. PATENT DOCUMENTS 5,489,880 A * 2/1996 Swarup .................... 333/128
5,618,777 A * 4/1997 Hey-Shipton et al. ...... 505/210
6,016,084 A * 1/2000 Sugimoto ..................... 333/12
6,734,760 B2 * 5/2004 Tsujiguchi .................. 333/172
7,084,720 B2 * 8/2006 Gomez et al. .............. 333/204
2003/0155990 A1 * 8/2003 Ye ........................... 333/99 S

* cited by examiner

*Primary Examiner*—Seungsook Ham
(74) *Attorney, Agent, or Firm*—Bacon & Thomas, PLLC

(57) ABSTRACT

The present invention is to provide a narrow bandpass filter installed on a circuit board for suppressing a high-frequency harmonic wave, which uses a metal microstrip method to directly build a microstrip circuit corresponding to a narrow bandpass filter on a circuit board of a wireless communication product and uses an interdigital finger method to lay a capacitor microstrip of the microstrip circuit on the circuit board to avoid the capacitor microstrip occupying too much area of the circuit board and maximizes the usable space of the circuit board, so that the wireless communication product can suppress a second or higher harmonic spurious noise of the wireless communication product without using an additional high-frequency filter, and thus can greatly lower the manufacturing cost of the wireless communication product and effectively reduce the electromagnetic interference.

4 Claims, 5 Drawing Sheets

NARROW BANDPASS FILTER INSTALLED ON A CIRCUIT BOARD FOR SUPPRESSING A HIGH-FREQUENCY HARMONIC WAVE

FIELD OF THE INVENTION

The present invention relates to a narrow bandpass filter, and more particularly to a narrow bandpass filter installed on a circuit board for suppressing a high-frequency harmonic wave.

BACKGROUND OF THE INVENTION

In recent years, the market indicates a drastic increase of demand for wireless communication products, and thus the wireless local area network (WLAN) is developing in a much faster pace, particularly after the IEEE 802.11 WLAN protocol was established around 1997, not only providing unprecedented functions for the WLAN communications, but also providing a universal solution for various wireless products of different brands and creating a new milestone for the development of WLAN. The IEEE802.11 WLAN protocol confirms the total solution of executing a single chip by a core device, which greatly lowers the cost of adopting wireless technologies, so that wireless networks can be used extensively in various wireless communication products.

When these wireless communication products carry out the wireless data transmission under a high power condition, a high-frequency harmonic spurious noise is produced and an electromagnetic interference results. Therefore, every developed country has established related laws and regulations to solve this problem. The import and use of wireless communication products incompliant to the laws and regulations are prohibited. In view of such laws and regulations, wireless communication product designers and manufacturers add a wave filter behind a power amplifier for the circuit layout and design in a limited space to suppress the high-frequency harmonic spurious noises in hope of producing a wireless communication product in compliance with the related laws and regulations of different countries. However, when each manufacturer designs and manufactures the control circuit for such wireless communication products, the wave filter is usually used for suppressing the second harmonic waves produced by these wireless communication products, but the high-frequency filter not only comes with a high price, but also has a relatively large size. Therefore, adding a high-frequency wave filter will greatly increase the manufacturing cost and volume of the product, which is obviously not suitable for the present trend of the design of a light, thin, short, compact, low-price and good-quality wireless communication product.

Further, a harmonic wave produced by a high-power transmitted signal is usually the most difficult part to pass an electromagnetic interference test required for the wireless communication products. More particularly, the second or higher harmonic wave used as the primary frequency of the transmitted signal is the most difficult one to meet the standards. Therefore, designing a wireless communication product in compliance with related laws and regulations without greatly increasing the manufacturing cost and volume of the product becomes an important issue for designers and manufactures to overcome.

SUMMARY OF THE INVENTION

In view of the shortcomings of the prior-art design and manufacture of the wireless communication products and the price paid for suppressing the second harmonic waves so produced, the inventor of the present invention based on years of experience in the wireless communication related industry to conduct extensive researches and experiments to overcome the shortcomings of the prior art and finally invented a narrow bandpass filter installed on a circuit board for suppressing a high-frequency harmonic wave in accordance with the present invention.

Therefore, it is an objective of the present invention to use a printed circuit board manufacturing technology to produce a circuit board of a wireless communication product by a metal microstrip method, which directly fabricates a microstrip circuit corresponding to a narrow bandpass filter on one side of the circuit board, wherein the microstrip circuit having a capacitor microstrip of a lager capacitance is connected by an interdigital finger and laid on the circuit board to avoid the capacitor microstrip occupying too much area of the circuit board and effectively maximize the usable space of the circuit board, such that the wireless communication product can effectively suppress the second or higher harmonic spurious noises produced by the non-linear distortion to the power amplifier of the wireless communication product without using an additional high-frequency filter, and thus can greatly lower the manufacturing cost of the wireless communication product and effectively reduce the electromagnetic interference.

Another objective of the present invention is to manufacture a microstrip circuit including other capacitor microstrips of smaller capacitance by using the mutually connected section in the layout to avoid the capacitor microstrip occupying the usable area on the circuit board.

A further objective of the present invention is to install the bandpass filter with an interdigital finger on the circuit board, wherein one end is an input end of the bandpass filter, and the other corresponding end is perpendicularly coupled to a first inductor microstrip in the shape of a mender line (such as S-shape or inverted U-shape). One end of the first inductor microstrip is perpendicularly coupled to an end of second inductor microstrip in the shape of a mender line (such as S-shape or inverted U-shape), and the other end is perpendicularly coupled to an end of a third inductor microstrip; wherein a connected end of the third inductor microstrip and the first inductor microstrip acts as an input end of the bandpass filter, and the other end of the second inductor microstrip and the third inductor microstrip is coupled to a ground surface on another side of the circuit board by a penetrating hole disposed on the circuit board. Therefore, the unused space on the circuit board can be used to lay out a narrow bandpass filter capable of effectively suppressing a high-frequency harmonic spurious noises, not only greatly reducing the manufacturing cost and the volume of the product, but also utilizing a narrowband technology to effectively suppress unwanted frequencies and allow the required frequency band to pass through. The invention also effectively avoids the receiving end of the wireless communication product to be interfered by unwanted frequencies.

The above and other objects, features and advantages of the present invention will become apparent from the following detailed description taken with the accompanying drawings.

DETAILED DESCRIPTION OF THE PREFERRED EMBODIMENTS

In general, a wave filter is a main indispensable component of a wireless communication product, and the present invention uses a microstrip technology to directly build the filter onto a circuit board of the wireless communication products, and thus can save any additional cost for purchasing the filter on one hand, and also can maximize the utility of unused space of the circuit board on the other hand. A narrowband technology is used to suppress the unwanted frequency and only allow the required frequency to pass through. However, a wireless communication product (such as a WLAN product) having transmitted signals of a main frequency 5.2 GHZ is built on a bandpass filter comprised of microstrips, which will occupy tremendous space on the circuit board. The way of producing a wireless communication product in compliance with the requirements for a light, thin, short and compact design and the utilization of the space of the circuit board are important key technologies.

Traditionally, the bandpass filter produced by the microstrip technology and installed on the circuit board of a wireless communication product is generally very large, and most of the bandpass filters operated at a frequency of 5 GHz and used for the WLAN are of wideband architectures such as the frequency band in the range of 5.1 GHz~5.8 GHz. Therefore, the inventor of the present invention designs a narrow bandpass filter installed on a circuit board for suppressing a high-frequency harmonic wave to comply with the Japanese wireless communication network with a 5.15 GHz~5.25 GHz narrowband requirement for wireless communication products. The narrow bandpass filter uses a printed circuit board manufacturing technology to manufacture a circuit board for the wireless communication product, and directly lay the narrowband filter on the side with an unused area of the circuit board, such that the narrowband filter can suppress the second or higher harmonic spurious noises produced by the power amplifier of the wireless communication product due to a linear distortion without using an additional high-frequency filter. Such arrangement can greatly lower the manufacturing cost of the wireless communication product and effectively reduce the electromagnetic interference.

Figure 1:
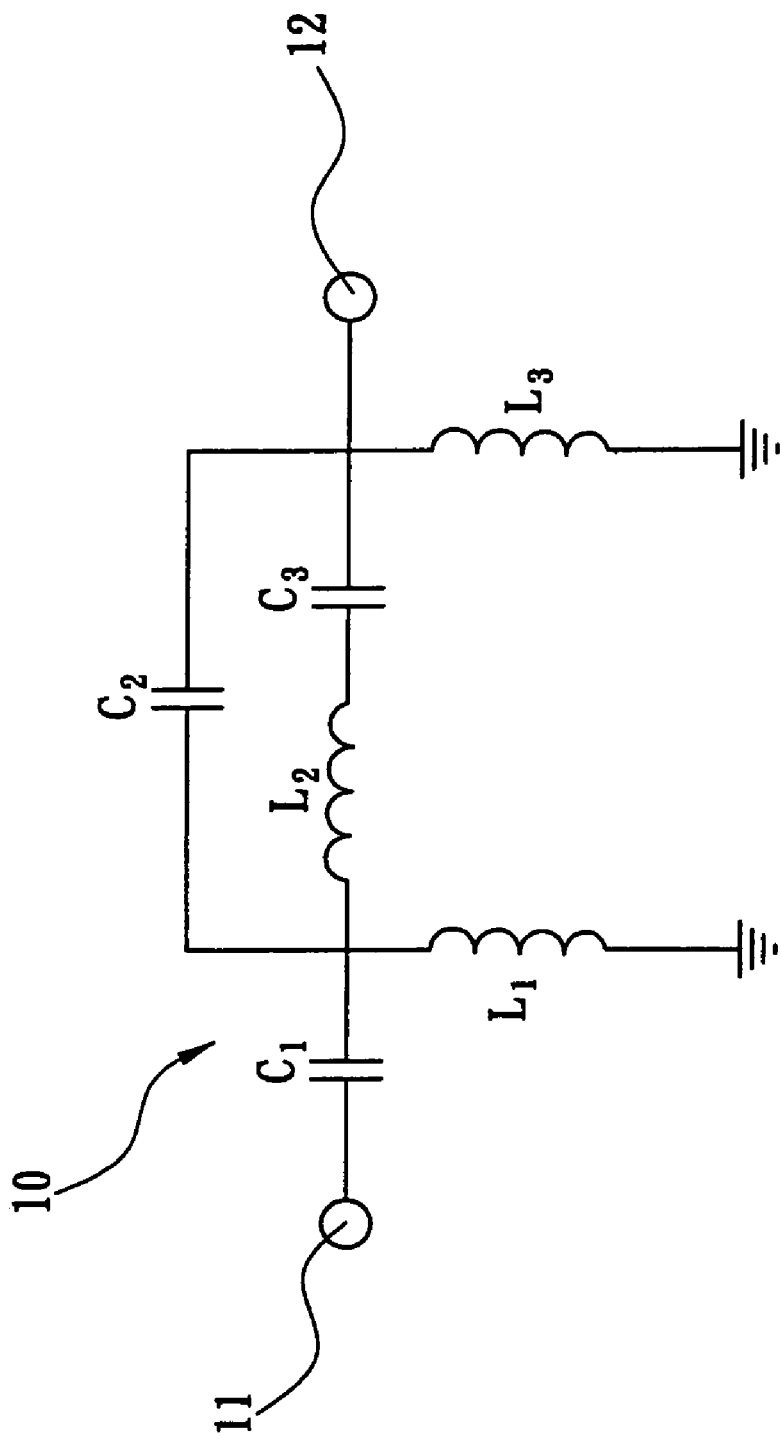
FIG. 1 is a schematic equivalent circuit diagram of a narrow bandpass filter according to a preferred embodiment of the present invention.

Please refer to FIG. 1 for an equivalent circuit diagram of the bandpass filter 10 according to a preferred embodiment of the present invention. An input end 11 of the bandpass filter 10 is coupled to an end of a first capacitor $C_1$ and the first capacitor $C_1$ provides the energy required for the circuit resonance, and the other end is coupled respectively to an end of a second capacitor $C_2$, a first inductor $L_1$ and a second inductor $L_2$; wherein the second capacitor $C_2$ is used for reducing and suppressing the frequency of a second harmonic wave. Thus, reducing the capacitance of the second capacitor $C_2$ can suppress the frequency of the second harmonic waves, and another end of the second capacitor $C_2$ is coupled to an output end 12 of the bandpass filter 10. The first inductor $L_1$ is used for supplying the energy required for the circuit resonance to increase the inductance of the first inductor $L_1$ and decrease the frequency of the bandpass frequency band, so as to reduce and suppress the frequency of the second harmonic wave. On the other hand, reducing the inductance of the first inductor $L_1$ can increase the bandwidth of the bandpass frequency band to improve the suppression of the frequency of the second harmonic wave. Another end of the first inductor $L_1$ is coupled to a ground and the second inductor $L_2$ is used to provide the energy required for the circuit resonance to improve the inductance of the second inductor $L_2$ for increasing the bandwidth of the bandpass frequency band to increase the frequency of the second harmonic wave. Further, reducing the inductance of the second inductor $L_2$ can decrease the frequency of the bandpass frequency band for reducing the frequency of the second harmonic wave to achieve the narrowband effect. Another end of the second inductor $L_2$ is coupled to one end of the first capacitor $C_3$, and increasing the capacitance of the third capacitor $C_3$ can decrease both of the bandpass frequency band and the frequency of the second harmonic wave. On the other hand, reducing the capacitance of the third capacitor $C_3$ can increase both of the bandpass frequency band and the frequency of the second harmonic wave. Another end of the third capacitor $C_3$ is coupled to an output end 12 of a bandpass filter 10 and the output end 12 is coupled to one end of a third inductor $L_3$, and increasing the inductance of the third inductor $L_3$ can decrease the bandwidth of the bandpass frequency band to achieve the narrowband effect. The circuit provided by an equivalent circuit according to this preferred embodiment uses a microstrip manufacturing technology to manufacture the circuit board for a wireless communication product by directly laying the microstrip circuit corresponding to the equivalent circuit on one side of the circuit board in order to manufacture a narrowband bandpass filter in accordance with the present invention.

Figure 2:
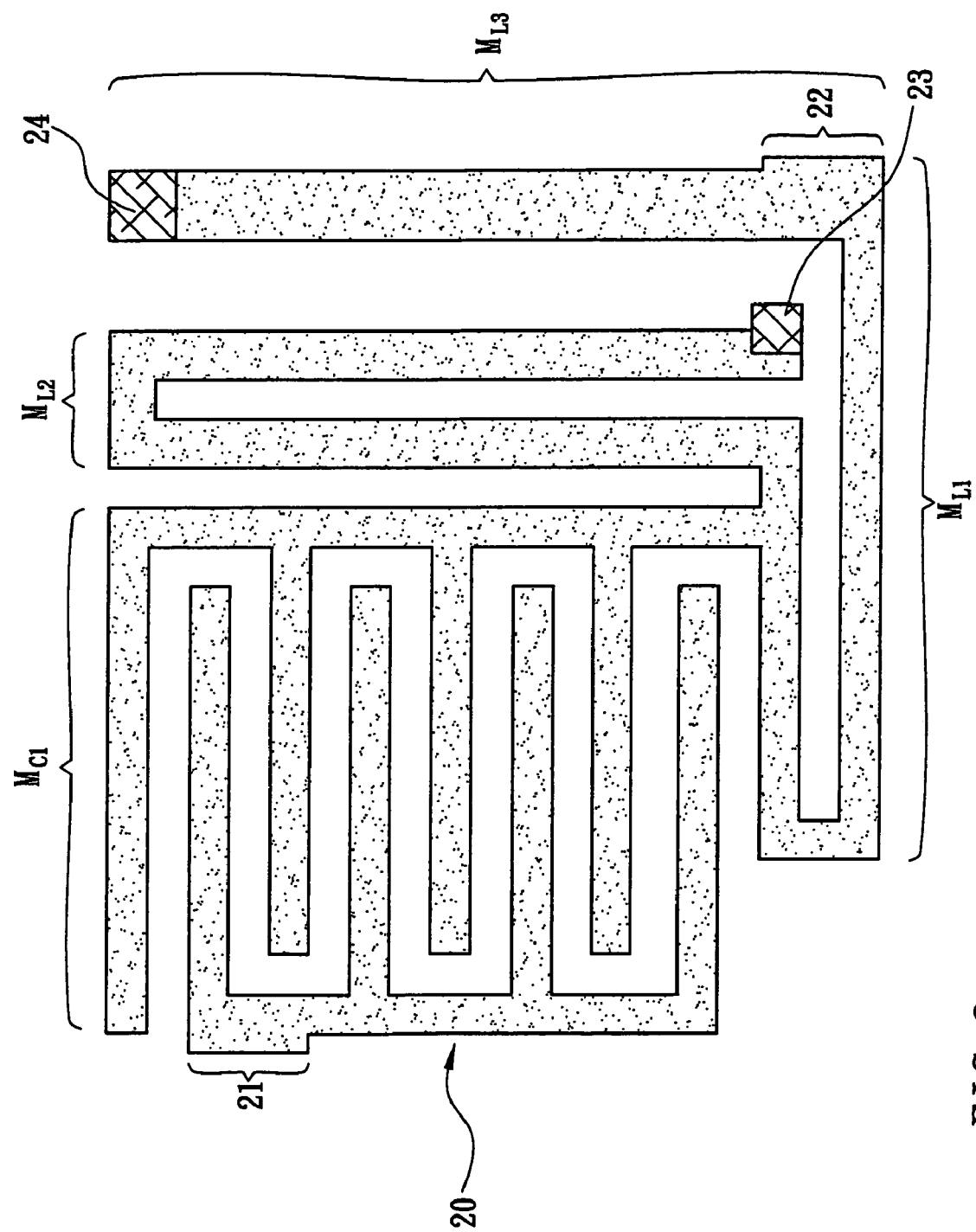
FIG. 2 is a schematic view of a microstrip circuit as depicted in FIG. 1.

In the preferred embodiment, a dielectric substrate (which a circuit board substrate) having a dielectric constant of 4.3, a thickness of 11.4 mils and a loss tangent of 0.0245 is taken for example. With reference to FIG. 2, the narrowband bandpass filter according to the design of the invention is built on an area of 134×114 mil$^2$. Since the capacitance of the first capacitor $C_1$ is very large, the preferred embodiment utilizes an interdigital finger layout to build the microstrip circuit corresponding to the first capacitor $C_1$ into that space to decrease the occupied area and solve the problem of having insufficient layout area. As to the second capacitor $C_2$ and the third capacitor $C_3$ having a smaller capacitance, they are manufactured by a mutually connected section in the layout.

Figure 3:
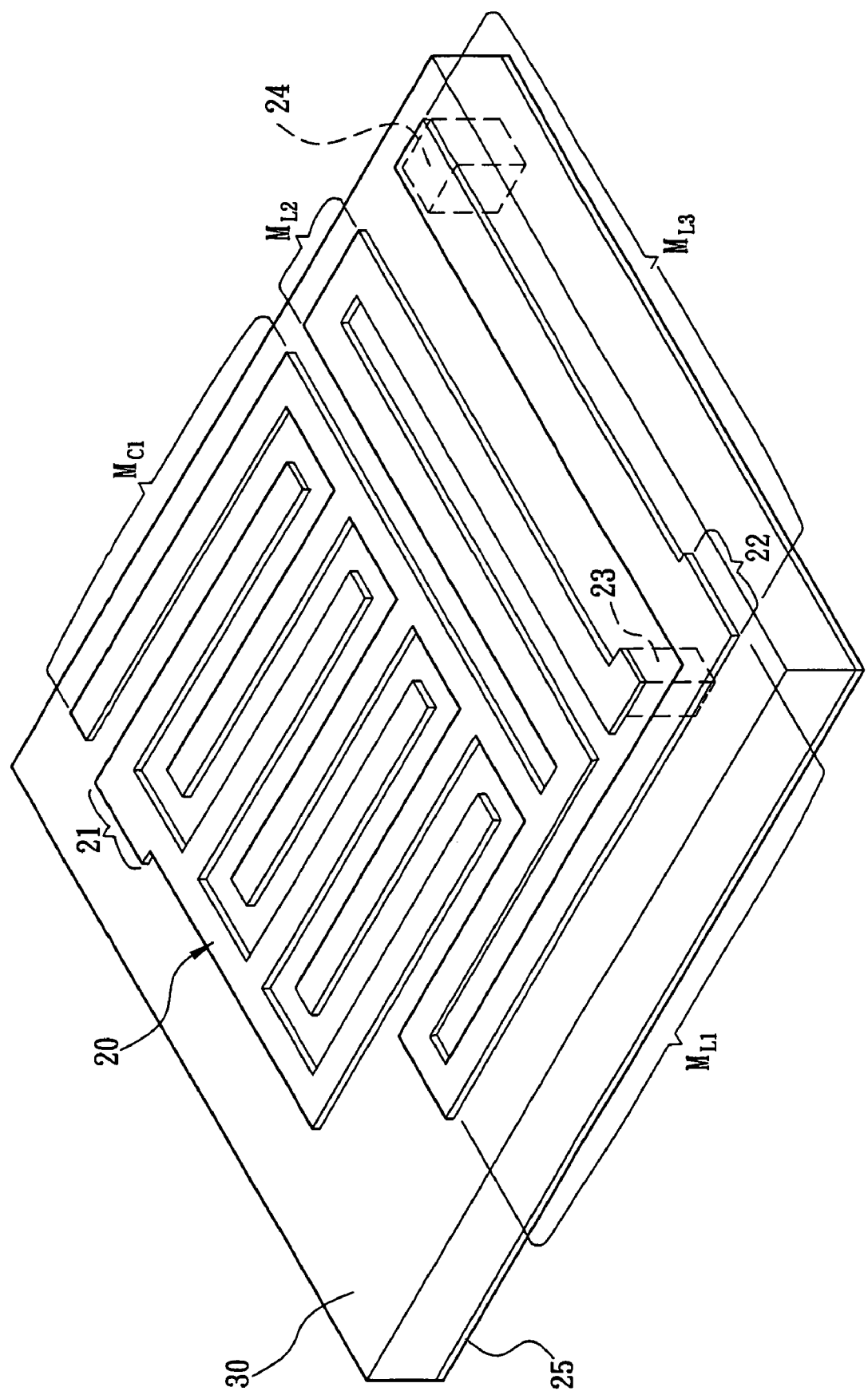
FIG. 3 is a perspective view of a portion of a wireless communication circuit board having a microstrip circuit installed thereon as depicted in FIG. 2.

Please refer to FIGS. 2 and 3 for a microstrip circuit corresponding to the bandpass filter 20 according to the preferred embodiment. The microstrip circuit comprises a first capacitor microstrip $M_{C1}$ being substantially an interdigital finger laid on a substrate 30 of the circuit board and having an end as an input end 21 of the bandpass filter 20, and the other end being perpendicularly coupled to a first inductor microstrip $M_{L1}$. The first inductor microstrip $M_{L1}$ is substantially in the shape of a meander line (such as an S-shape or an inverted U-shape), and one end is perpendicularly coupled to an end of a second inductor microstrip $M_{L2}$ and the second inductor microstrip $M_{L2}$ is also substantially in the shape of a meander line (such as an S-shape or an inverted U-shape). Another end of the first inductor microstrip $M_{L1}$ is perpendicularly coupled to an end of a third inductor microstrip $M_{L3}$; where in the connected end of the third inductor microstrip $M_{L3}$ and the first inductor microstrip $M_{L1}$ is used as an output end 22 of the bandpass filter 20, and another connected end of the second inductor microstrip $M_{L2}$ and the third inductor microstrip $M_{L3}$ is coupled respectively to a ground surface 25 on the other side of the circuit board by a penetrating hole 23, 24 on the circuit board. The second inductor microstrip $M_{L2}$ and the third inductor microstrip $M_{L3}$ are disposed in parallel intervals on the same side of the first capacitor microstrip $M_{C1}$. With an appropriate adjustment of the width and length of each microstrip, the bandpass filter 20 can be built on the circuit board to effectively suppress unwanted frequencies and just allow the required frequency to pass through.

Figure 4:
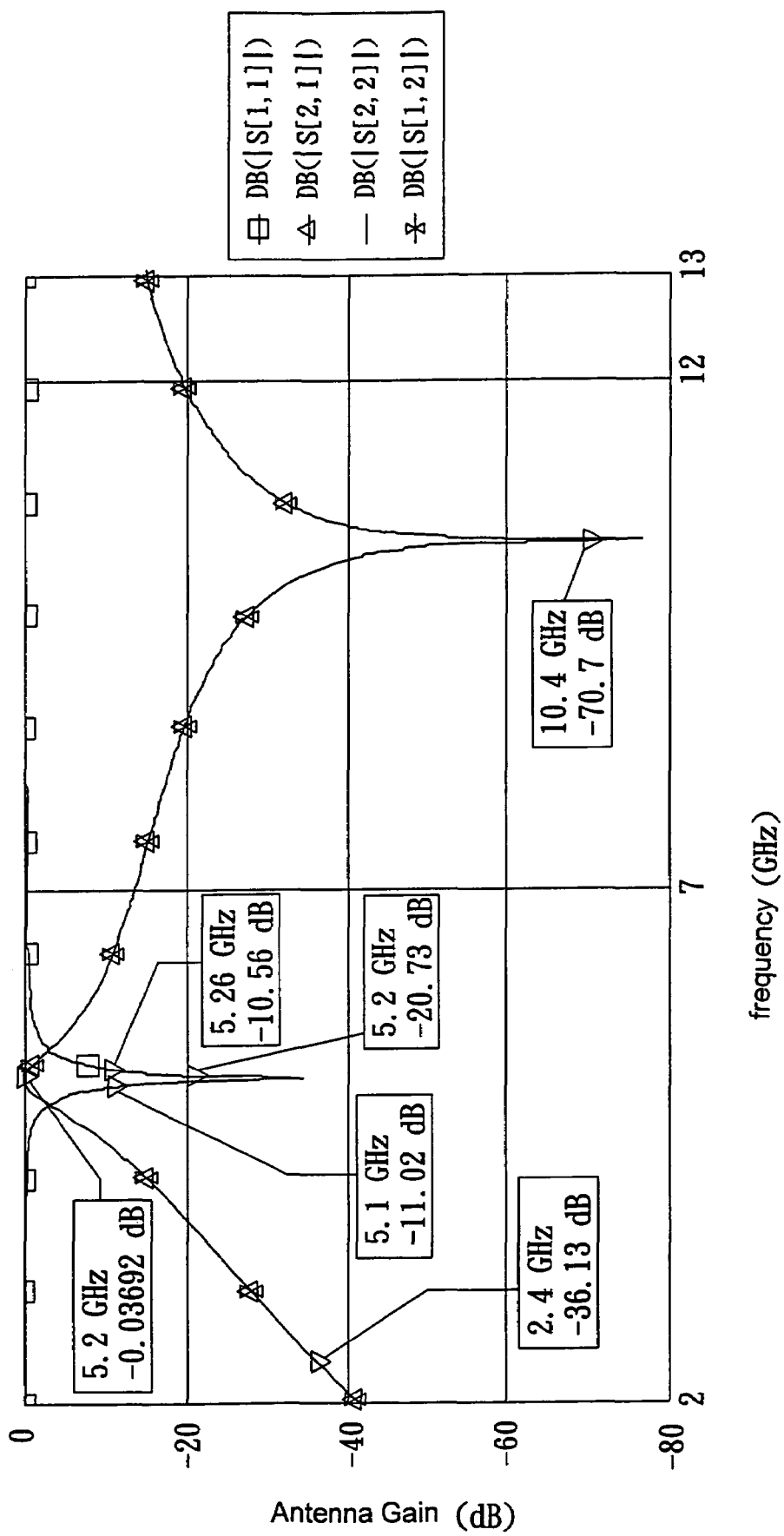
FIG. 4 is a simulated frequency echo diagram of the equivalent circuit as depicted in FIG. 1 after a wave filter for a wireless communication product is performed.

With reference to the preferred embodiment as shown in FIG. 1, if the capacitances of the first capacitor $C_1$, second capacitor $C_2$ and third capacitor $C_3$ are 2.925 pF, 0.0815 pF and 0.1743 pF respectively, and the inductance of the first inductor $L_1$, second inductor $L_2$, third inductor $L_3$ are 0.6 nH, 4.211 nH, and 0.623 nH respectively, then the frequency echo of the output end can be simulated after appropriately adjusting each capacitance and inductance and feeding back a high-power transmitted signal produced by a wireless communication to the input end 11 of the bandpass filter 10. In FIG. 4, the frequency echo diagram clearly shows that the loss is approximately 0.03692 dB at 5.2 GHz, and the suppression of the second harmonic wave of 10.4 GHz is 36.13 dB. The width of the bandpass frequency is approximately 5.1~5.26 GHz, which complies with the Japanese WLAN specification. The frequencies falling in the neighborhood of 5.3~5.8 GHz will be eliminated to achieve a satisfactory suppression effect.

Figure 5:
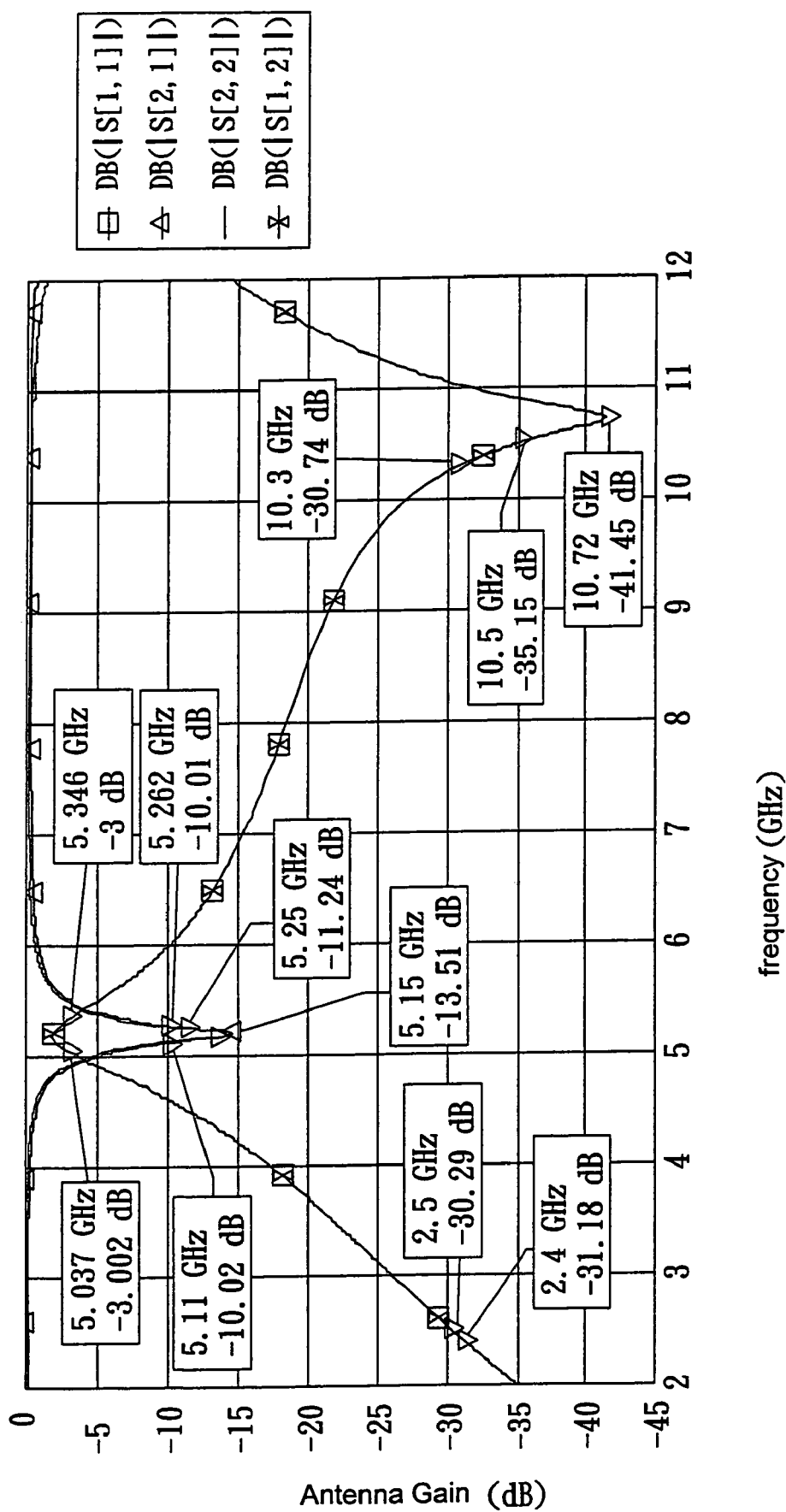
FIG. 5 is an actual frequency echo diagram of the microstrip circuit as depicted in FIG. 2 after a wave filter for a wireless communication product is performed.

With reference to the manufacture of the narrowband bandpass filter 20 as shown in FIGS. 2 and 3 according to the foregoing capacitances and inductances by using a microstrip manufacturing technology, the width and length of each microstrip is adjusted appropriately to suppress unwanted frequencies and just allow the required 5.2 GHz frequency to pass through. Therefore, after a high power transmitted signal produced by a wireless communication product is fed back to the input end 21 of the bandpass filter 20, the actual measured frequency echo of the output end 22 can be obtained by the frequency echo diagram as shown in FIG. 5. The loss introduced by the 5.19 GHz frequency is approximately 1.923 dB; the suppression of the 10.5 GHz second harmonic wave is 35.15 dB; and the suppression of the 2.4 GHz harmonic wave of an industrial scientific medical bands (ISM) frequency band is 31.18 dB having a bandpass frequency of 5.11~5.25 GHz that complies with the Japanese WLAN specification. Any frequency next to this range will be eliminated.

In view of the description, the present invention uses a microstrip technology to produce a no-cost, small, powerful narrowband bandpass filter on the circuit of a wireless communication product. The narrowband bandpass filter not only effectively lowers the cost of the product, but also effectively suppresses unwanted high-frequency harmonic waves and keeps the required frequency bandwidth to pass through by appropriately modifying the size of the inductor and capacitor microstrips or selecting the circuit board substrate with various different dielectric constants, and thus further expedites the certification process required by the EMI laws and regulations for the product.

While a preferred embodiment of the invention has been shown and described in detail, it will be readily understood and appreciated that numerous omissions, changes and additions may be made without departing from the spirit and scope of the invention.

What is claimed is:

1. A narrow bandpass filter installed on a circuit board for suppressing a high-frequency harmonic wave, using a printed circuit board manufacturing technology for manufacturing a circuit board of a wireless communication product by means of a metal microstrip method of directly building a microstrip circuit corresponding to a narrow bandpass filter on a side of said circuit board; wherein said microstrip circuit comprises a capacitor microstrip and using an interdigital finger method to lay said microstrip circuit on said circuit board, wherein said capacitor microstrip uses one end as an input end of said bandpass filter and the other end for perpendicularly coupling to a first inductor microstrip, wherein said first inductor microstrip is substantially in the shape of a meander line, having an end perpendicularly coupled to an end of a second inductor microstrip and the other end perpendicularly coupled to an end of a third inductor microstrip, and wherein an end where said third inductor microstrip and said first inductor microstrip are connected serves as an output end of said bandpass filter.

2. The narrow bandpass filter of claim 1, wherein said second inductor microstrip is substantially in the shape of a meander line, and the other connected end of said second inductor microstrip and said third inductor microstrip are respectively coupled to a ground surface disposed on another side of said circuit board through a penetrating hole, and said second inductor microstrip and said third inductor microstrip are disposed adjacent to each other and in parallel intervals on one side of said capacitor microstrip.

3. The narrow bandpass filter of claim 2, wherein said first inductor microstrip and said second inductor microstrip are substantially in the shape of an inverted U-shape meander line.

4. The narrow bandpass filter of claim 2, wherein said first inductor microstrip and said second inductor microstrip are substantially in the shape of an S-shape meander line.

* * * * *